United States Patent
Yu et al.

(10) Patent No.: US 7,590,013 B2
(45) Date of Patent: Sep. 15, 2009

(54) SEMICONDUCTOR MEMORY DEVICES HAVING VARIABLE ADDITIVE LATENCY

(75) Inventors: So-Young Yu, Hwaseong-si (KR); Jae-Kyung Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 211 days.

(21) Appl. No.: 11/711,647

(22) Filed: Feb. 28, 2007

(65) Prior Publication Data

US 2008/0025117 A1    Jan. 31, 2008

(30) Foreign Application Priority Data

Jul. 7, 2006    (KR) ............... 10-2006-0064100

(51) Int. Cl.
*G11C 11/063*    (2006.01)

(52) U.S. Cl. ............. 365/194; 365/193; 365/233.1; 365/233.13

(58) Field of Classification Search ............. 365/194, 365/230.05, 193, 233.1, 233.13; 323/63, 323/37

See application file for complete search history.

(56) References Cited

U.S. PATENT DOCUMENTS

| | | | | |
|---|---|---|---|---|
| 6,087,851 A * | 7/2000 | Kim et al. | | 326/63 |
| 6,125,064 A | 9/2000 | Kim et al. | | |
| 2005/0122795 A1* | 6/2005 | Fujisawa et al. | | 365/191 |
| 2005/0128828 A1* | 6/2005 | Lee | | 365/194 |
| 2006/0245277 A1* | 11/2006 | Lee | | 365/193 |
| 2007/0156996 A1* | 7/2007 | Chung | | 711/167 |

FOREIGN PATENT DOCUMENTS

| | | |
|---|---|---|
| JP | 11-203859 | 7/1999 |
| JP | 2002-074961 | 3/2002 |
| KR | 10-1999-0040859 | 6/1999 |
| KR | 10-2000-0043978 | 7/2000 |
| KR | 10-2002-0031853 | 5/2002 |
| KR | 10-2003-0078134 | 10/2003 |
| KR | 10-2004-0056602 | 7/2004 |
| KR | 10-2004-0074283 | 8/2004 |
| KR | 10-2005-0011954 | 1/2005 |
| KR | 10-2006-0062429 | 6/2006 |

OTHER PUBLICATIONS

A Korean Notice of Allowability (dated Jun. 21, 2007) for counterpart Korean Patent Application No. 10-2006-0064100 is provided for the purpose of certification under 37 C.F.R. § 1.97(e).

* cited by examiner

*Primary Examiner*—Vu A Le
*Assistant Examiner*—Han Yang
(74) *Attorney, Agent, or Firm*—Harness, Dickey & Pierce, P.L.C.

(57) ABSTRACT

A semiconductor memory device includes an additive latency setting unit configured to receive a mode setting code from an external unit in response to the mode setting signal during a mode setting operation, set an additive latency value in response to the mode setting code, and receive the mode setting code in response to the additive latency setting signal during a normal operation, and an additive latency changing unit configured to change the additive latency value in response to the mode setting code during the normal operation.

9 Claims, 10 Drawing Sheets

SEMICONDUCTOR MEMORY DEVICES HAVING VARIABLE ADDITIVE LATENCY

PRIORITY STATEMENT

This non-provisional U.S. patent application claims priority under 35 U.S.C. §119 to Korean Patent Application No. 2006-0064100, filed Jul. 7, 2006, the entire contents disclosure of which are incorporated herein by reference.

BACKGROUND

Description of the Related Art

Related art semiconductor memory devices may have CAS latency CL and/or additive latency AL. CAS latency represents the number of clocks until data are output to an external portion after a read command is input to a memory device. For example, a CAS latency of 3 indicates data are output to the external portion 3 clock cycles lapse after a read command is input to the memory device. The CAS latency value represents timing for outputting data. The memory device detects the CAS latency value set during an initial operation, and uses the detected CAS latency value to access and output data.

Additive latency is discussed in DDR2 specifications and represents the number of clocks from input of a read/write command during a normal operating state of the memory device to a RAS to CAS delay (tRCD). "tRCD represents" denotes the time from input of a row address to input of a column address. The memory device begins operating when the row address is input, and the read/write command is input before the column address is input. The additive latency is referred to as the time period from when the read/write command is input to the time that the column address executing the internal read/write command is input.

A related art semiconductor memory device may receive the read/write command during a read/write operation and delays the received read/write command during the additive latency AL before generating and outputting the internal read/write command. A related art synchronous memory device receives an active command, a read/write command and a pre-charge command for data access, and the additive latency means time from the receipt of the read/write command in the related art synchronous memory device to the generation of the internal read/write command.

For example, if AL=2, the internal read command may be generated and is performed after a lapse of 2 clocks after the read command is input to the memory device. A related art synchronous memory device without additive latency receives the read/write command and performs a corresponding data access operation after a lapse of clocks corresponding to tRCD after the active command is input. However, the synchronous memory device with the additive latency may receive the read/write command faster using the additive latency even though tRCD does not lapse after the active command is input.

The CAS latency may be used in a related art synchronous semiconductor memory device and is set by a mode setting code stored in a mode register. The additive latency is set by an extended mode setting code.

FIG. 1 is a block diagram illustrating a related art semiconductor memory device.

In FIG. 1, an address register 11 receives addresses ADD from an external portion, and classifies the addresses ADD as a bank address BA, a row address RA or a column address CA. The address register 11 transmits the classified addresses ADD to a bank selecting portion 12, a row decoder 13 or a column decoder 14 based on the classification of each address ADD and in response to an active signal ACT applied from a command decoder 17.

The bank selecting portion 12 activates a corresponding row decoder among a plurality of row decoders 13 in response to the bank address BA. Each of the plurality of row decoders 13 designates a respective bank of a memory cell array 15, and the row decoder 13 activated by the bank selecting portion 12 receives the row address RA from the address register 11 to designate a row of the corresponding bank.

The column decoder 14 receives the column address CA from a latency controller 19 and decodes the column address CA to designate a column of the memory cell array 15.

The memory cell array 15 may include a plurality of word lines arranged in a transverse direction, a plurality of bit lines arranged in a vertical direction, a plurality of memory cells arranged at crossing points between the word lines and the bit lines and a sense amplifying portion having a plurality of sense amplifiers which detect and amplify data. The memory cell array 15 operates such that the memory cells of the word line selected by the row decoder 13 are selected and the sense amplifier selected by the column decoder 14 detects and amplifies data DQ of a memory cell among the memory cells of the selected word line.

A data I/O portion 16 outputs data DQ from the memory cell of the memory cell array designated by the bank selecting portion 12, the row decoder 13 and the column decoder 14 to the external portion, or stores data DQ applied from the external portion in the designated memory cell, in response to an internal read/write command p-RD/p-WR output from the latency controller 19. The data I/O portion 16 receives the CAS latency from a latency setting portion 20 to output data at a time specified by the CAS latency CL to the external portion during the data read operation.

The command decoder 17 analyzes a command CMD applied from the external portion to output a mode setting signal MRS, which is a setting signal for a basic setting of the semiconductor memory device to the mode register 18, and outputs the read/write command RD/WR for controlling data input/output to the latency controller 19. The command CMD applied from the external portion includes /RAS, /CAS and /WE signals, and the mode setting signal MRS is output when all of the /RAS, /CAS and /WE signals have a low level.

The mode register 18 combines the mode setting code M_CODE applied from the external portion in response to the mode setting signal MRS to store the basic setting of the semiconductor memory device when the mode setting signal MRS is applied from the command decoder 17. The mode setting code M_CODE may be applied in the form of an address or data. Related art semiconductor memory devices have only one mode setting code M_CODE configuration stored in the mode register 18. However, the mode setting code M_CODE may vary as the function of related art semiconductor memory devices, and a setting of the additive latency is stored in such an extended mode setting code M_CODE.

For example, the mode register 18 analyzes the mode setting code M_CODE applied from the external portion to determine whether the mode setting code M_CODE is a basic mode setting code or an extended mode setting code. The mode register 18 outputs a basic mode signal MR to the latency setting portion 20 when the mode setting code M_CODE is the basic mode setting code and an extended mode signal EMR when the mode setting code M_CODE is the extended mode setting code.

Because a setting change is possible while all banks are in a pre-charge state, the latency setting portion 20 receives an inverted active signal ACTB from the command decoder 17 to become activated, and decodes a latency setting code MRA to output the additive latency AL in response to the extended mode signal EMR applied from the mode register 18. When the basic mode signal MR is applied from the mode register 18, the latency setting portion 20 receives a setting for the CAS latency to output the CAS latency to the data I/O portion 16.

The latency controller 19 functions as a buffer, and outputs the internal read/write command p-RD/p-WR after a delay of the additive latency AL when the additive latency AL is applied from the latency setting portion 20 and the read/write command RD/WR is applied from the command decoder 17. The latency controller 19 receives and delays the column address CA by the additive latency AL before being output it to the column decoder 14.

FIGS. 2A and 2B are timing diagrams illustrating an example operation of a related art semiconductor memory device having additive latency.

Referring to FIG. 2A, the additive latency is set to 2 clocks, and the CAS latency is set to 4 clocks. When the read command RD is applied from the command decoder 17, the internal read command p-RD is output from the latency controller 19 2 clocks later as a result of the additive latency. When the internal read command p-RD is applied, the data I/O portion 16 outputs data DQ to the external portion after a delay of the CAS latency CL applied from the latency setting portion 20. However, as shown in FIG. 2A, when the read command RD is not applied continuously, data DQ are not output continuously and bubbles may occur. Bubbles may result in a loss of data line bandwidth through which data is output.

Referring to FIG. 2B, the additive latency is set to 2 clocks and the CAS latency is set to 2 clocks. Unlike FIG. 2A, compulsory bubbles of 4 clocks are needed in the data line. In order to generate bubbles of 4 clocks, the read command RD require bubbles of 4 clocks. However, bubbles of the read command RD may result in loss of command line bandwidth.

As shown in FIGS. 2A and 2B, damage of bandwidth of the data or command line may be reduced by adjusting the additive latency AL differently at each read command. However, because the additive latency AL of the existing semiconductor memory device may be changed only when all banks are in the pre-charge state, it is inefficient because the change requires a longer time to adjust the additive latency AL.

FIG. 3 is a block diagram illustrating mode register 18 and part of the latency setting portion 20 of the related art semiconductor memory device shown in FIG. 1. A procedure for setting the additive latency will be explained with regard to FIG. 3.

Referring to FIG. 3, the mode register 18 receives the mode setting code M_CODE from the external portion in response to the mode setting signal MRS applied from the command decoder 17. Although not shown in FIG. 3, when the mode setting signal M_CODE is an extended mode setting code, the mode register 18 outputs the extended mode signal EMR to a mode determining portion 22 of the latency setting portion 20, and outputs the latency setting code MRA, which sets the additive latency among the extended mode setting code M_CODE, to the latency setting portion 20.

The latency setting portion 20 includes a mode setting activating portion 21, a mode determining portion 22 and a latency decoder 23. The mode setting activating portion 21 receives and transmits the latency setting code MRA to the mode determining portion 22 when the inverted active signal ACTB is applied from the command decoder 17. The mode determining portion 22 transmits the latency setting code MRA to the latency decoder 23 when the extended mode signal EMR is applied from the mode register 18. The latency decoder 23 decodes the latency setting code MRA to output the additive latency AL.

FIG. 4 is a circuit diagram illustrating the mode register and the latency setting portion of FIG. 3, in which only a portion for setting the additive latency is shown.

Referring to FIG. 4, the mode register 18 receives the mode setting code M_CODE when the mode setting signal MRS is applied, and part of the extended mode setting code M_CODE is a setting for the additive latency.

TABLE 1

| | BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|---|
| MRS | 0 | 0 | PD | | tWR | | DLL | TM | | CAS Latency | | BT | | Burst Length | |
| EMRS | 0 | 1 | Qoff | 1 | /DQS | | OCD Program | | Rtt | | Additive Latency | | Rtt | D.I.C | DLL |

Table 1 shows an example of the mode setting code M_CODE of a DDR2 SDRAM, in which the mode setting code M_CODE is applied in the form of an address. In Table 1, a MRS line represents a basic mode setting code, and an EMRS line represents an extended mode setting code. The basic mode setting code and the extended mode setting code are distinguished by bank addresses BA0 and BA1.

As shown in Table 1, an address A7 of the basic mode setting code is used to set a test mode TM, addresses A4 to A6 are used to set the CAS latency and addresses A0 to A2 are used to set a burst length. The basic mode setting code is used to set a basic operation of a related art semiconductor memory device. The extended mode setting code is a mode setting code which is added as a function of the related art semiconductor memory device, and addresses A3 to A5 of the extended mode setting code are used to set the additive latency.

The procedure for setting the additive latency of FIG. 4 is explained below with reference to Table 1.

The mode register 18 receives the mode setting codes A3 to A5 from the external portion and transmits the latency setting codes MRA3 to MRA5 to the mode setting activating portion 21 when the mode setting signal MRS is applied from the command decoder 17. In order to change the additive latency, the extended mode setting code may be changed, and the mode setting code M_CODE may be changed when all banks are in the pre-charge state. Thus, the mode setting activating portion 21 transmits the latency setting codes MRA3 to MRA5 to the mode determining portion 22 when the inverted active signal ACTB is applied. The mode determining portion 22 transmits the latency setting codes MRA3 to MRA5 to the latency decoder 23 in response to the extended mode signal EMR applied from the mode register 18. The latency decoder 23 decodes the latency setting codes MRA3 to MRA5 to output the additive latencies AL0 to AL5 having corresponding values.

As can be seen in FIG. 4, the additive latency may be changed by changing the extended mode setting code, and the mode setting code M_CODE may be changed only when all banks are in the pre-charge state. For example, the related art semiconductor memory device may not change the additive latency by the mode setting activating portion 21 during the active operation. Thus, the additive latency is used "as is" without changing, even though damage of the bandwidth of the data and/or command line may occur due to the bubbles as shown, for example, in FIG. 2.

SUMMARY

Example embodiments relate to semiconductor memory devices, for example, to a semiconductor memory device in which an additive latency may be changed in a normal operation state.

At least one example embodiment provides a semiconductor memory device in which the additive latency may be changed during normal operation so that efficiency of the data and command lines may be improved.

At least one example embodiment provides a semiconductor memory device. The semiconductor memory device may include an additive latency setting portion and an additive latency changing portion. The additive latency setting unit configured to set an additive latency value in response to a received mode setting code during a mode setting operation, and configured to receive the mode setting code in response to an additive latency setting signal during a normal operation. The additive latency changing unit for changing the additive latency value in response to the mode setting code during the normal operation.

In at least one example embodiments, the additive latency setting portion may include a mode register and a latency setting portion. The mode register configured to receive the mode setting code in response to the mode setting signal or the additive latency setting signal and output a mode signal and a latency setting code in response to the mode setting code, the mode signal being one of a basic mode signal and an extended mode signal. The latency setting unit configured to receive the latency setting code in response to the extended mode signal and a control signal output from the command decoder to output the additive latency value. The latency setting unit includes, a mode setting activating unit configured to receive the latency setting code from the mode register and transmit the latency setting code, in response to the control signal, and a mode determining unit configured to receive the latency setting code from the mode setting activating unit and output the latency setting code, in response to the extended mode signal. The additive latency changing unit includes, an additive latency switching unit configured to receive the latency setting code from the mode register and transmit the latency setting code in response to the additive latency setting signal. In at least one example embodiments, the latency setting unit further includes, a latency decoder configured to receive the latency setting code from the mode determining unit or the additive latency switching unit and decode the latency setting code to output the additive latency value.

BRIEF DESCRIPTION OF THE DRAWINGS

Example embodiments will become more apparent to those of ordinary skill in the art by describing in detail the example embodiments shown in the attached drawings in which.

DETAILED DESCRIPTION OF EXAMPLE EMBODIMENTS

Figure 1:
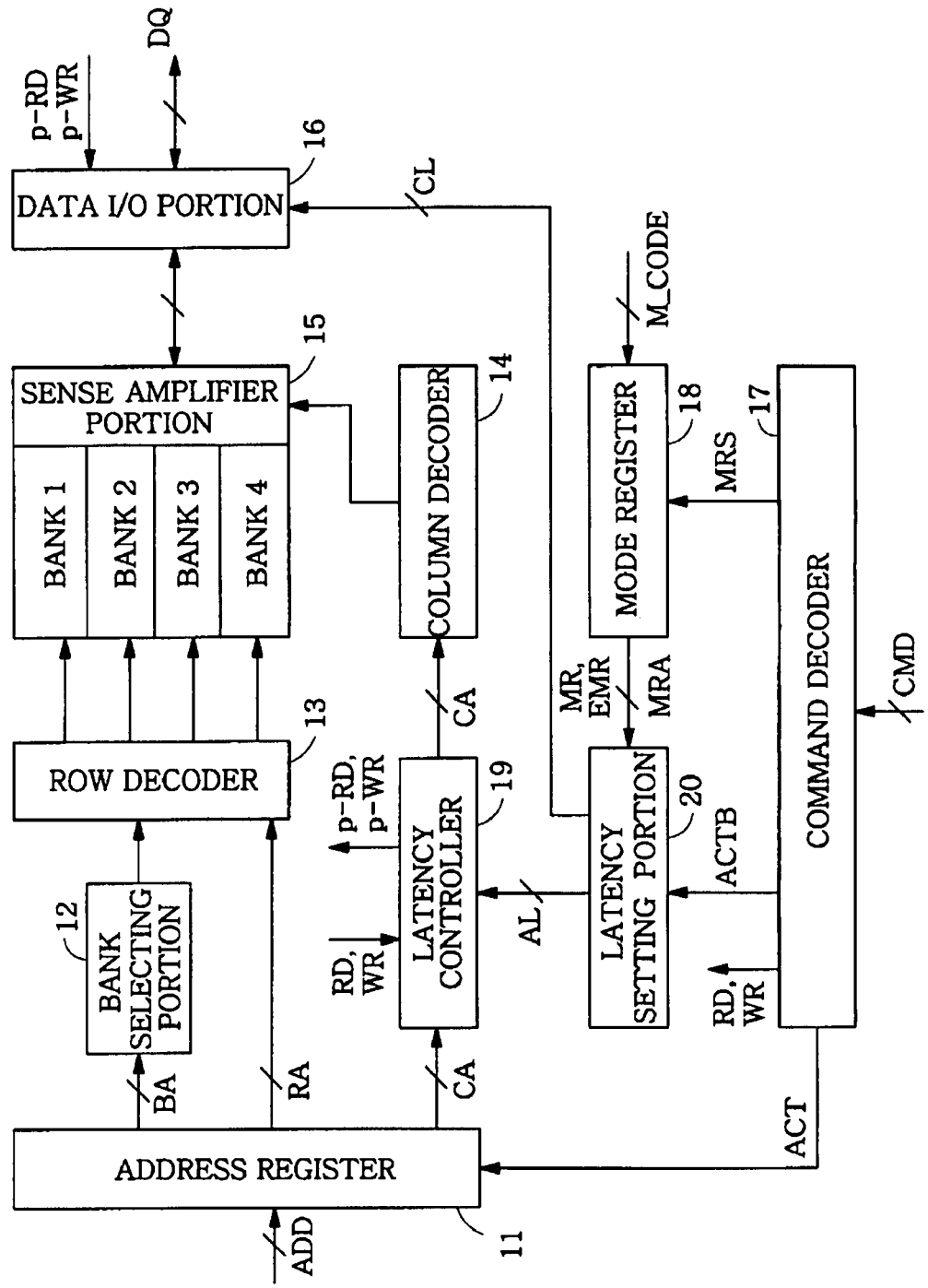
FIG. 1 is a block diagram illustrating a related art semiconductor memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 5:
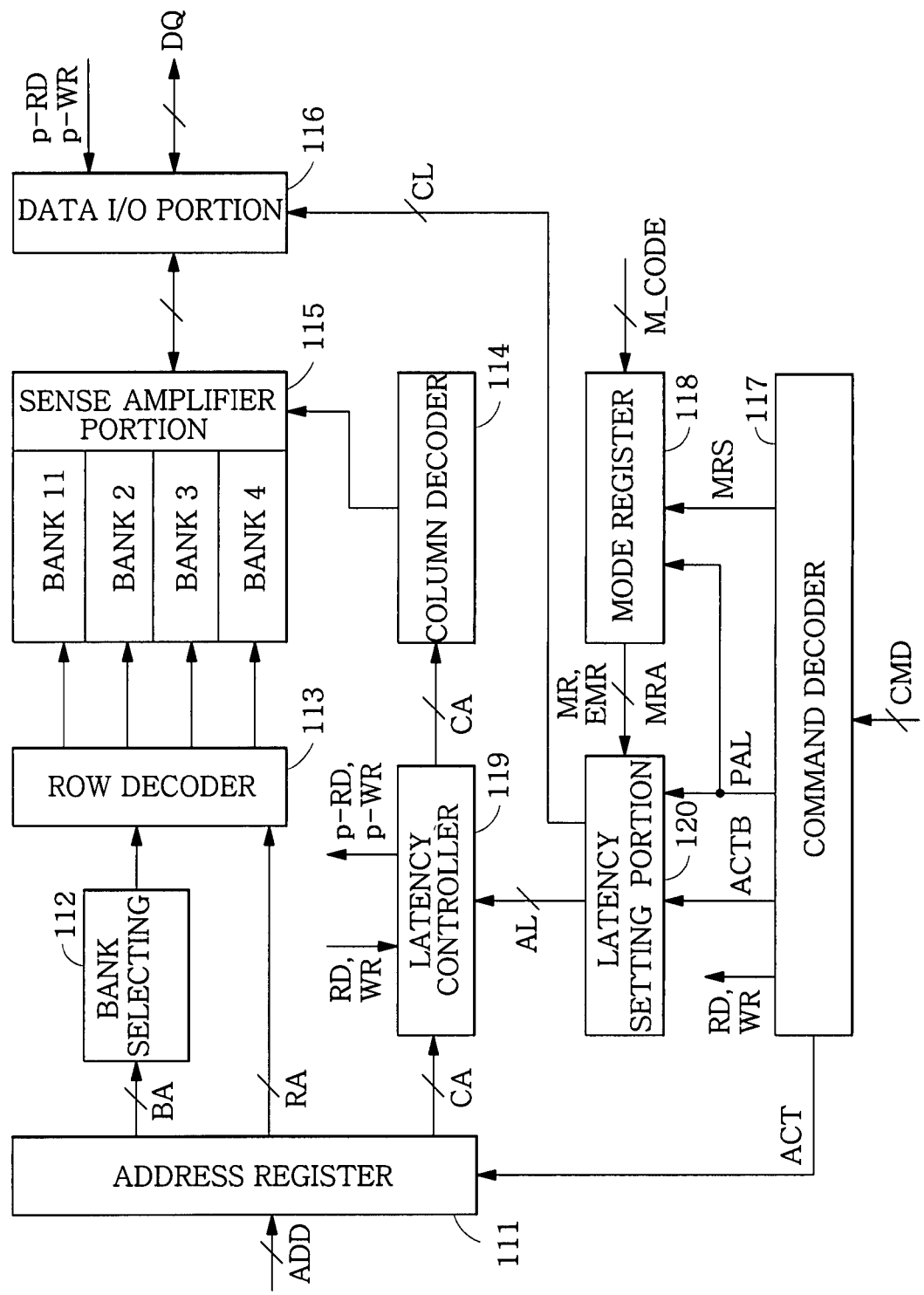
FIG. 5 is a block diagram illustrating a semiconductor memory device, according to an example embodiment.

FIG. 5 is a block diagram illustrating a semiconductor memory device, according to an example embodiment.

Referring to FIG. 5, an address register 111 may receive addresses ADD from an external portion and classify the received addresses as bank addresses BA, row addresses RA or column addresses CA. The classified addresses may be transmitted to a bank selecting portion 112, a row decoder 113 or a column decoder 114, respectively, based on the classification of each address and/or in response to an activation signal ACT applied from a command decoder 117.

The bank selecting portion 112 may activate a corresponding row decoder 113 among a plurality of row decoders 113 in response to the bank address BA. A plurality of row decoders 113 may designate respective banks of a memory cell array 115, and the row decoder 113 activated by the bank selecting portion 112 may receive the row address RA from the address register 111 to designate a row of the corresponding bank.

The column decoder 114 may receive the column address CA from a latency controller 119 and decode the received column address CA to designate a column of the memory cell array 115.

The memory cell array 115 may include a plurality of word lines arranged in a transverse direction, a plurality of bit lines arranged in a vertical direction, a plurality of memory cells arranged at crossing points between the word lines and the bit lines and/or a sense amplifying portion having a plurality of sense amplifiers, which may detect and amplify data. The memory cell array 115 may operate such that the memory cells of the word line selected by the row decoder 113 are selected and the sense amplifier selected by the column decoder 114 may detect and amplifies data DQ of a memory cell among the memory cells of the selected word line.

A data I/O portion 116 may output data DQ from the memory cell of the memory cell array designated by the bank selecting portion 112, the row decoder 13 and/or the column decoder 114 to the external portion, or may store data DQ applied from the external portion in the designated memory cell, in response to an internal read/write command p-RD/p-WR output from the latency controller 119. The data I/O portion 116 may receive the CAS latency from a latency setting portion 120 to output data at the time specified by the CAS latency CL to the external portion during the data read operation.

The command decoder 117 may analyze a command CMD applied from the external portion to output a mode setting signal MRS to the mode register 118, and output the read/write command RD/WR for controlling data input/output to the latency controller 119. When an additive latency change command is also applied, the command decoder 117 may output an additive latency setting signal PAL to the mode register 118 and the latency setting portion 120. The additive latency setting signal PAL may change the mode setting code M_CODE during a normal operating state as well as when all banks are in a pre-charge state.

TABLE 2

| /RAS | /CAS | /WE | Command |
|------|------|-----|---------|
| L | L | L | Mode register setting |
| L | L | H | Refresh |
| L | H | L | Pre-charge |
| L | H | H | Active |
| H | L | L | Write |
| H | L | H | Read |
| H | H | L | Additive latency setting |
| H | H | H | No operation |

Table 2 shows example commands applied to the command decoder 117 of a semiconductor memory device, according to an example embodiment. The command CMD applied from the external portion may include, for example, /RAS, /CAS and/or /WE signals. The command decoder 117 may determine the state of the signals to generate the mode register setting signal MRS, and internal commands such as Refresh, Active (ACT), Read (RD) and/or Write (WR). In at least this example embodiment, when the /RAS and /CAS signals have a high level and the /WE signal has a low level, the additive latency setting signal PAL may be defined. Other combinations of signals may be used for defining additive latency setting. For example, the command decoder 117 may output the additive latency setting signal PAL other than the mode register setting signal MRS even when all of the /RAS, /CAS and /WE signals have a low level.

The mode register 118 may combine the mode setting code M_CODE applied from the external portion in response to the mode setting signal MRS to store the basic setting of the semiconductor memory device when the mode setting signal MRS is applied from the command decoder 117. The mode register 118 may output the basic mode signal MR when the mode setting code M_CODE applied from the external portion is a basic mode setting code, and may output the extended mode signal EMR to the latency setting portion 120 when the mode setting code M_CODE is an extended mode setting code. Related art mode registers are designed to receive the mode setting code M_CODE in response to the mode setting signal MRS, however, the mode register 118 of FIG. 5 may receive the mode setting code M_CODE in response to the additive latency setting signal PAL and/or the mode setting signal MRS.

The latency setting portion 120 may be activated in response to the inverted active signal ACTB applied from the command decoder 117 when all or substantially all banks are pre-charged or in response to the additive latency setting signal PAL applied from the command decoder 117 when in a normal operating state. When activated the latency setting portion 120 may decode the latency setting code MRA to output the additive latency AL in response to the extended mode setting signal applied from the mode register 118. When the basic mode setting code is stored in the mode register 118, the latency setting portion 120 may receive a setting for the CAS latency to output the CAS latency CL to the data I/O portion 116.

For example, when the additive latency change command is applied from the external portion, the semiconductor memory device of FIG. 5 may output the additive latency setting signal PAL from the command decoder 117 and may output the additive latency AL through the mode register 118 and the latency setting portion 120 in response to the additive latency setting signal PAL.

Figure 6:
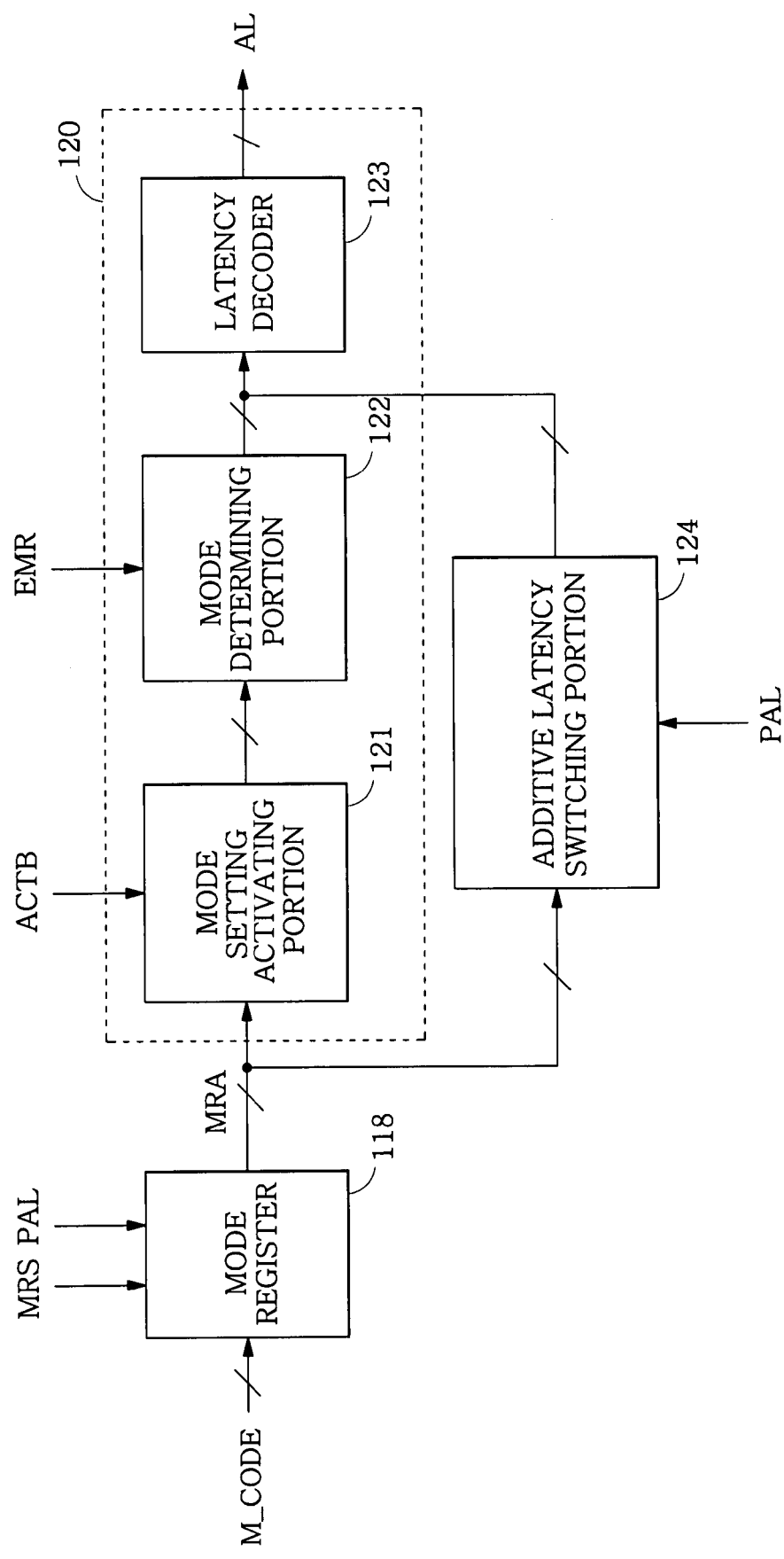
FIG. 6 is a block diagram illustrating a mode register and part of a latency setting portion, according to an example embodiment.

FIG. 6 is a block diagram illustrating a portion of a semiconductor memory device, according to an example embodiment, in more detail. FIG. 6 shows the mode register 118 and part of the latency setting portion 120 of the semiconductor memory device of FIG. 5. The latency setting portion 120 may set the additive latency AL and/or set the CAS latency CL in response to the basic mode signal MR applied from the mode register 118, however, because a setting for the CAS latency CL is unrelated (e.g., not directly related) to example embodiments, the latency setting portion 120 of FIG. 6 shows only the part of the latency setting portion for setting the additive latency CL.

Referring to FIG. 5, the mode register 118 may receive the mode setting signal MRS or the additive latency signal PAL from the command decoder 117. The mode setting signal MRS may be generated, for example, when the /RAS, /CAS and /WE signals, which constitute the command CMD, have a low level. The additive latency setting signal PAL may be generated when the /RAS and /CAS signals have a high level, and the /WE signal has a low level as shown in Table 2. The mode register 118 may receive the mode setting code M_CODE from the external portion in response to the additive latency setting signal PAL and the mode setting signal MRS.

As shown in Table 1, when the mode setting code M_CODE is applied in the form of an address ADD, the mode register 118 may determine whether the mode setting code M_CODE is a basic mode setting code or an extended mode setting code based on bank addresses BA0 and BA1. When the applied mode setting code M_CODE is the extended mode setting code EMRS, the mode register 118 may output the latency setting codes MRA and A3 to A5 together with the extended mode signal EMR to the latency setting portion 120.

Figure 3:
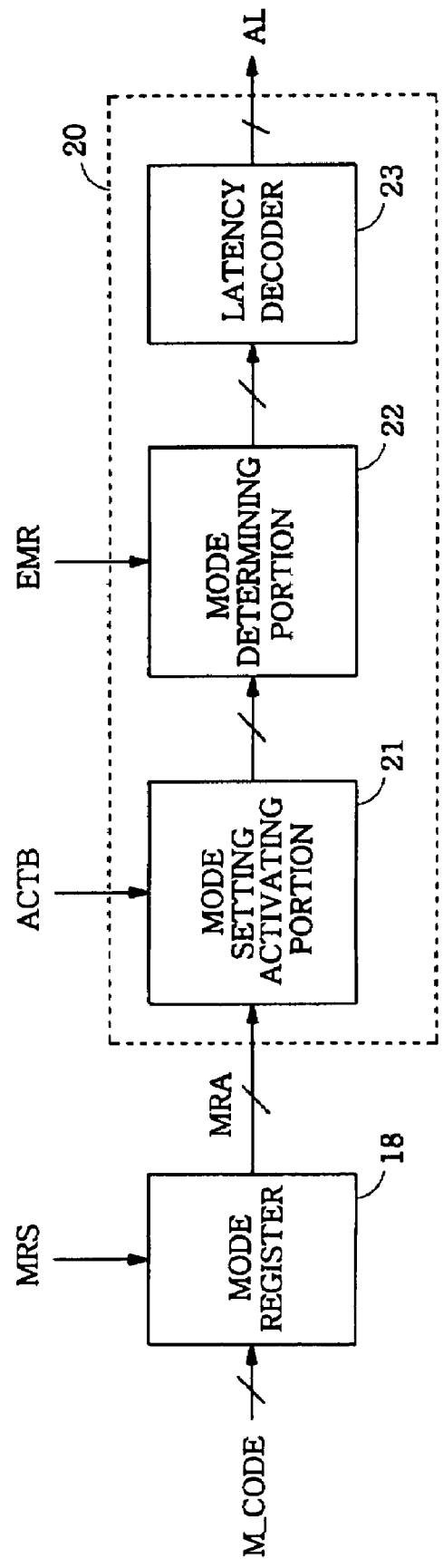
FIG. 3 is a block diagram illustrating a mode register and part of a latency setting portion of the related art semiconductor memory device of FIG. 1.
Figure 4:
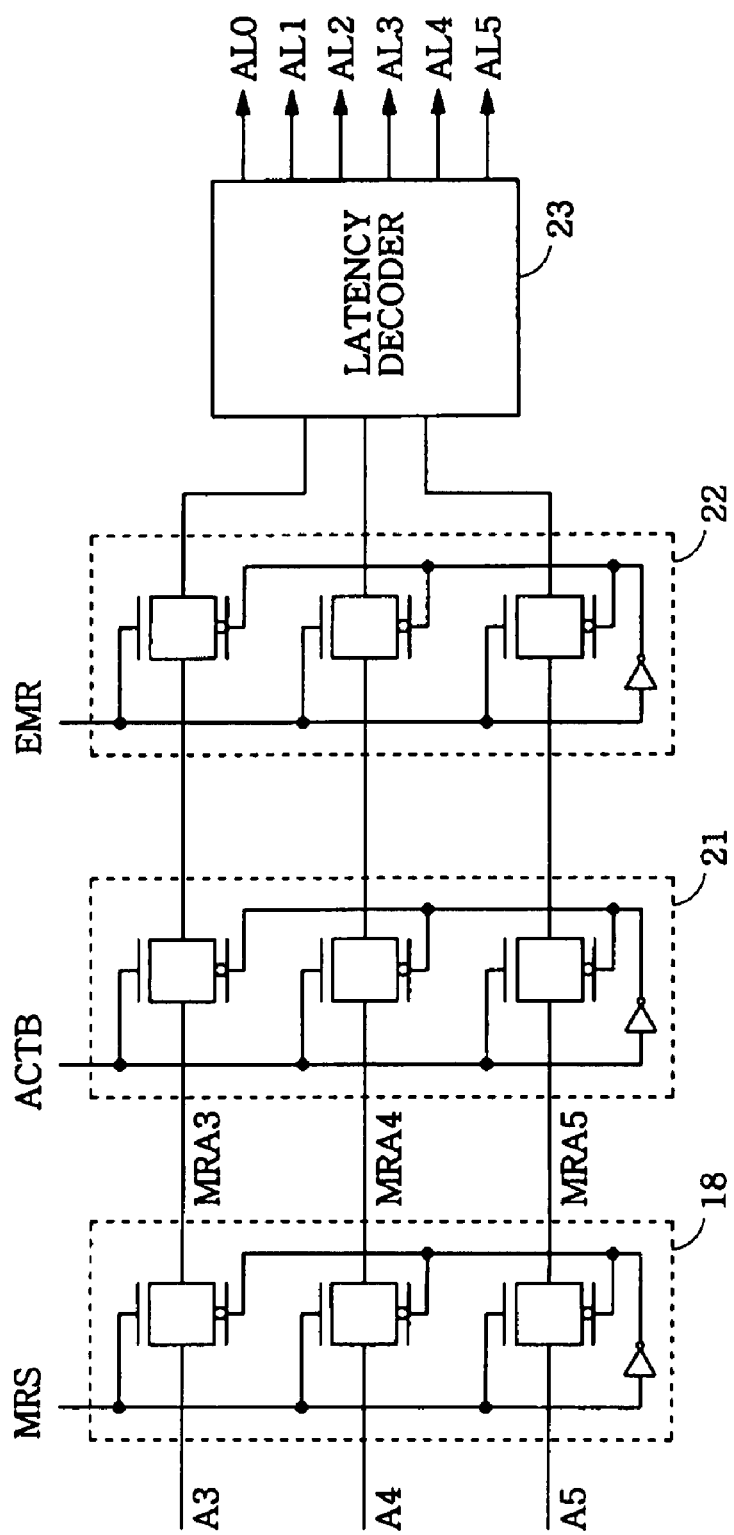
FIG. 4 is a circuit diagram illustrating the mode register and the latency setting portion of FIG. 3.

The latency setting portion 120 may include a mode setting activating portion 121, a mode determining portion 122, a latency decoder 123 and/or an additive latency switching portion 124. Similar to that as discussed above with regard to FIG. 3, the mode setting activating portion 121 may receive and transmit the latency setting code MRA to the mode determining portion 122 when the inverted active signal ACTB is applied from the command decoder 117. The mode determining portion 122 may transmit the latency setting code MRA applied from the mode setting activating portion 122 to the latency decoder 123 when the extended mode signal EMR is applied from the mode register 118 by the extended mode setting code. The additive latency switching portion 124 may receive and transmit the latency setting code MRA from the mode register 118 to the latency decoder 123 in response to the additive latency setting signal PAL. The latency decoder 123 may decode the latency setting code MRA applied from the mode determining portion 122 or the additive latency switching portion 124 to output the additive latency AL.

As described above, the mode register 118 of FIG. 6 may output the latency setting code MRA to the latency setting portion 120 in response to the mode setting signal MRS and the additive latency setting signal PAL. The latency setting portion 120 may apply the latency setting code MRA to the latency decoder 123 in response to the additive latency setting signal PAL through a path (e.g., discrete path) referred to as the additive latency switching portion 124 without passing through the mode setting activating portion 121. As a result, the latency setting code MRA may be transmitted in response to the inverted active signal ACTB when all banks are pre-charged, and a semiconductor memory device, according to at least some example embodiments, may change additive latency AL in a normal operating state.

Figure 7:
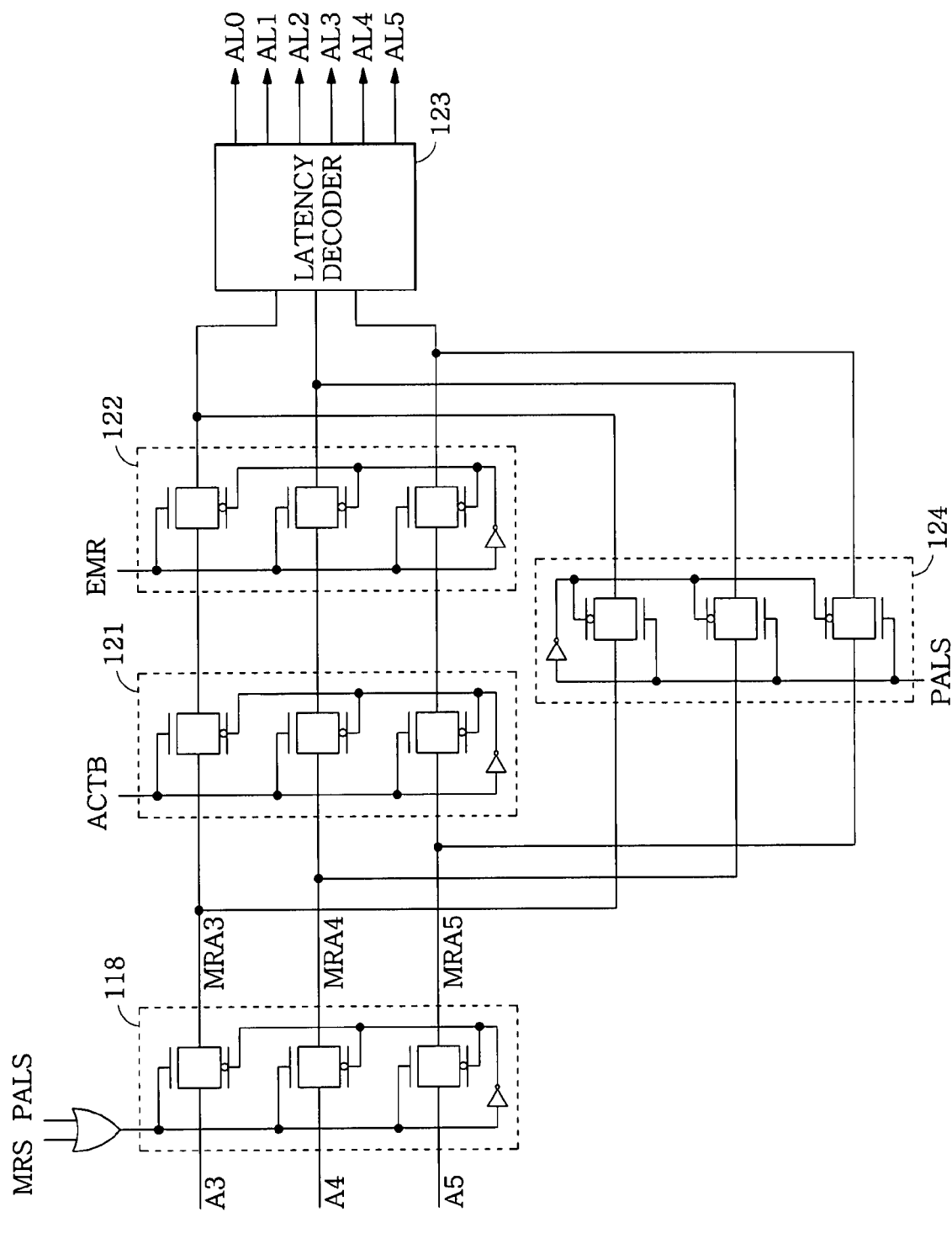
FIG. 7 is a circuit diagram illustrating a mode register and the latency setting portion, according to an example embodiment.

FIG. 7 is a circuit diagram illustrating a mode register and the latency setting portion, according to an example embodiment. Referring to FIG. 7 and Table 1, the mode register 118 may receive the mode setting code M_CODE in response to the mode setting signal MRS and the additive latency setting signal PAL applied from the command decoder 117. The mode setting code M_CODE may be applied in the form of an address ADD, and the mode register 118 may determine whether a mode setting code M_CODE is a basic mode setting code or an extended mode setting code using the bank address BA1 and BA0 of the addresses ADD. When the mode setting code M_CODE is an extended mode setting code, the mode register 118 may receive the addresses A3 to A5 to output the latency setting codes MRA3 to MRA5 together with the extended mode signal EMR to the latency setting portion 120 as the mode setting code for a setting of the additive latency.

The latency setting portion 120 may include the mode setting activating portion 121, the mode determining portion 122, the latency decoder 123 and/or the additive latency switching portion 124, and the latency setting codes MRA3 to MRA5 output from the mode register 118 may be applied to the mode setting activating portion 121 and the additive latency switching portion 124, respectively. In this example, the mode setting activating portion 121 may be activated in response to the inverted active signal ACTB applied from the command decoder 117, and the additive latency switching portion 124 may be activated in response to the additive latency setting signal PAL applied from the command decoder 117. For example, the mode setting activating portion 121 may be activated during the pre-charge state of all banks and may transmit the latency setting codes MRA3 to MRA5 to the mode determining portion 122. The mode determining portion 122, which receives the latency setting codes MRA3 to MRA5, may output the latency setting codes MRA3 to MRA5 to the latency decoder 123 in response to the extended mode signal EMR applied from the mode register 118. In another example, the additive latency switching portion 124 may be activated during the normal operating state of the semiconductor memory device if the additive latency setting signal PAL is applied, to output the latency setting codes MRA3 to MRA5 applied from the mode register 118 to the latency decoder 123.

The latency decoder 123 may decode the latency setting codes MRA3 to MRA5 applied from the mode determining portion 122 or the additive latency switching portion 124 to output corresponding additive latencies AL0 to AL5.

TABLE 3

| MRA5 | MRA4 | MRA3 | AL |
|---|---|---|---|
| 0 | 0 | 0 | AL0 |
| 0 | 0 | 1 | AL1 |
| 0 | 1 | 0 | AL2 |
| 0 | 1 | 1 | AL3 |

TABLE 3-continued

| MRA5 | MRA4 | MRA3 | AL |
|---|---|---|---|
| 1 | 0 | 0 | AL4 |
| 1 | 0 | 1 | AL5 |
| 1 | 1 | 0 | Not set |
| 1 | 1 | 1 | Not set |

Table 3 shows example additive latencies AL0 to AL5, which may be output from the latency decoder 123 in response to the latency setting codes MRA3 to MRA5. In Table 3, the additive latency may be set from AL0 to AL5, but may not be set for the rest. The additive latency AL is the additional delay time, and may usually be used up to AL4 or AL5, whereas the remaining additive latency may not be set for an additional setting of the semiconductor memory device. However, in another example embodiment, all additive latencies may be set.

FIG. 7 shows the mode register and part of the latency setting portion, according to an example embodiment. As shown, the mode register and part of the latency setting portion may include transmission gates for the sake of clarity, however, the mode register and latency setting portion may be realized in different forms.

Figure 8A:
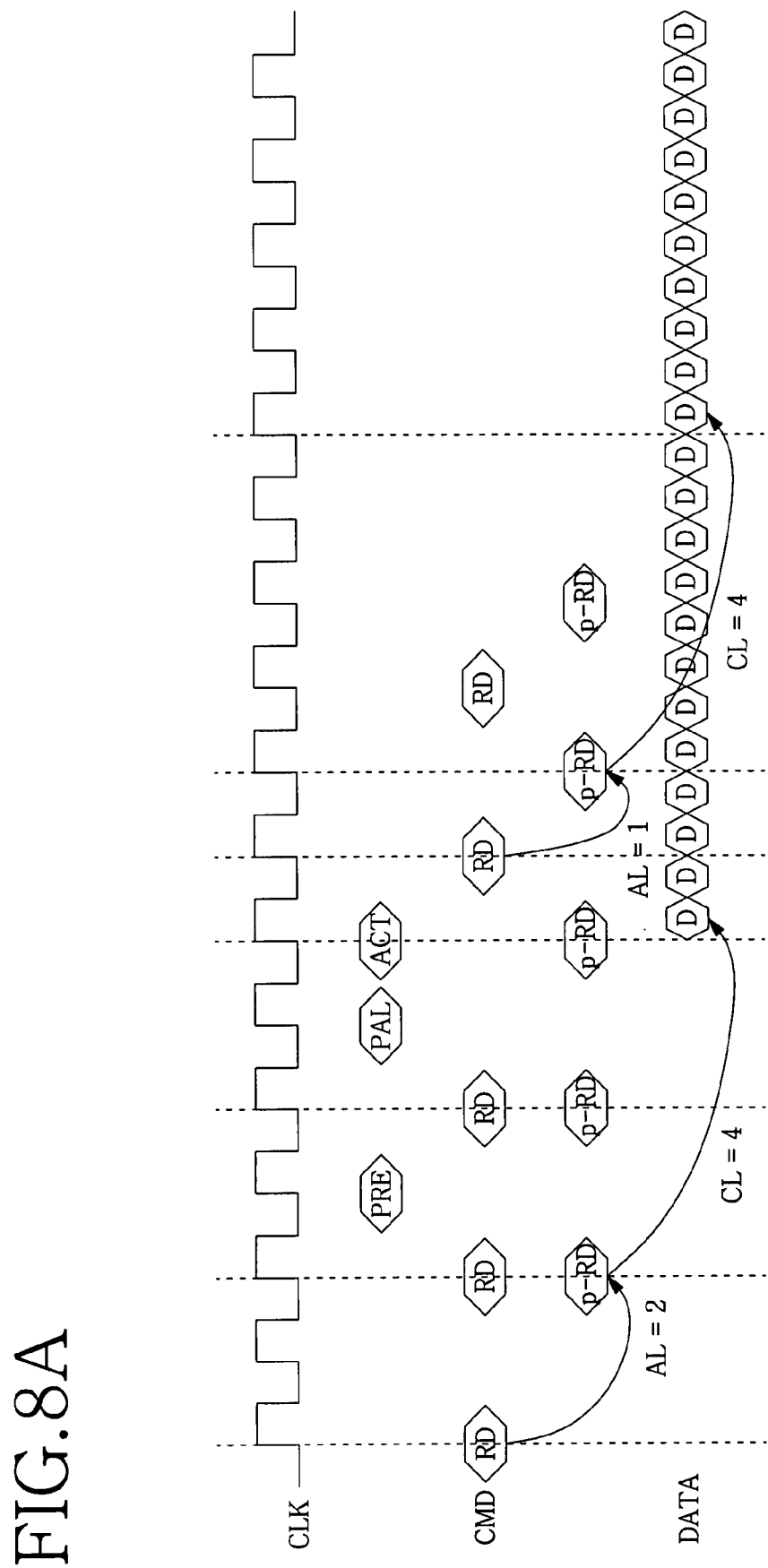
FIGS. 8A and 8B are timing diagrams illustrating an operation of a semiconductor memory device, according to an example embodiment.
Figure 8B:
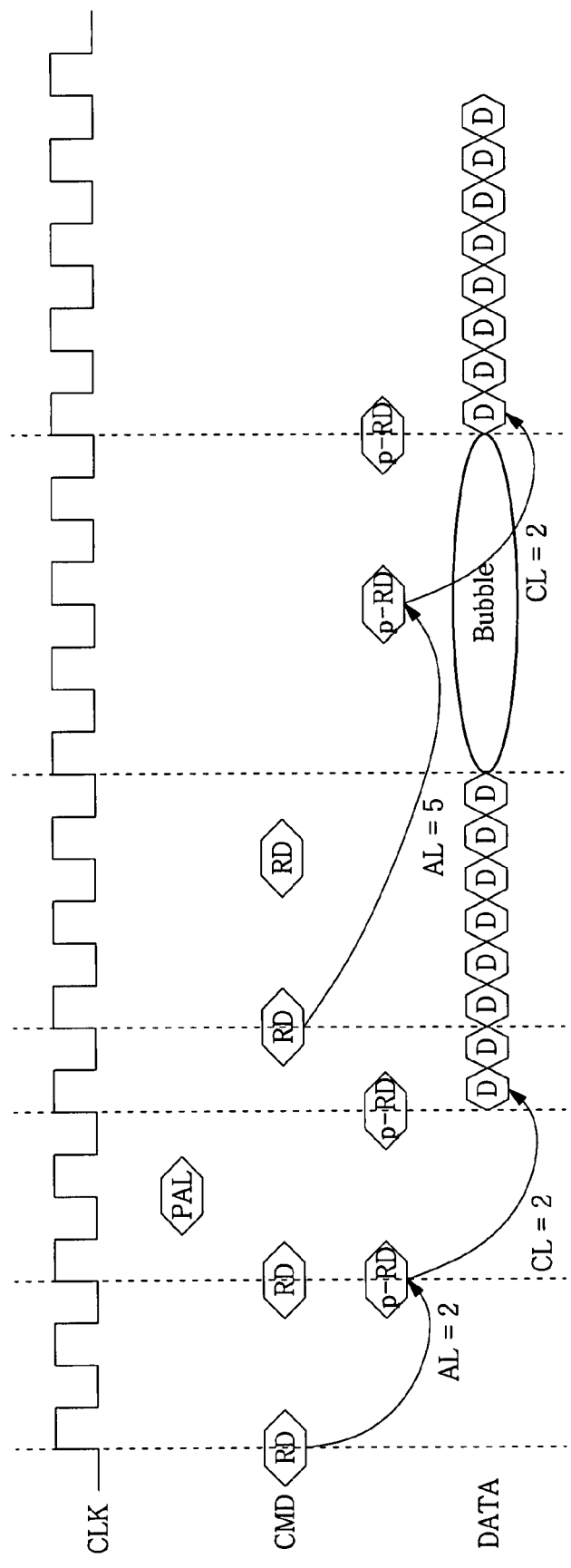

FIGS. 8A and 8B are timing diagrams illustrating an example operation of a semiconductor memory device, according to an example embodiment. FIGS. 8A and 8B show that the bandwidth of the data and command lines may be used more efficiently in semiconductor memory devices, according to example embodiments.

Figure 2A:
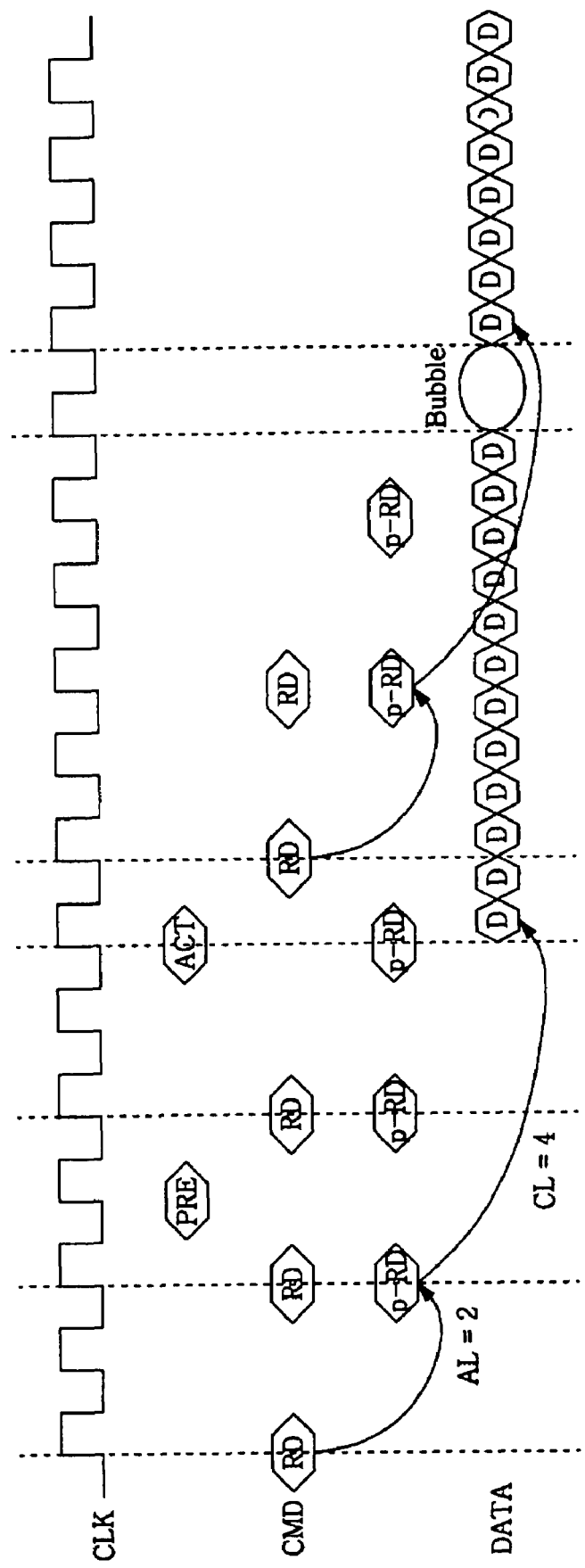
FIGS. 2A and 2B are timing diagrams illustrating an example operation of the related art semiconductor memory device with an additive latency.

Similar to FIG. 2A, in FIG. 8A, the additive latency may be set to 2 clocks, and the CAS latency may be set to 4 clocks. When the read command RD is applied from the command decoder 117, the internal read command p-RD may be output from the latency controller 119 after 2 clocks due to the additive latency. When the internal read command p-RD is applied, the data I/O portion 116 may output data DQ to the external portion after clocks corresponding to the CAS latency CL applied from the latency setting portion 120. However, if the read command RD is not expected to be applied during a time period (e.g., one clock), the external portion may apply a command to the command decoder 117 in advance so that the additive latency setting signal PAL is generated, and the mode register 118 which receives the additive latency setting signal PAL, may receive the mode setting code M_CODE from the external portion to output the latency setting code MRA to the latency setting portion 120. In this example, because the additive latency AL should be "1", the address A3 has a value of "1" and the addresses A4 and A5, respectively, have a value of "0" as the addresses for setting the additive latency in the mode setting code M_CODE according to Table 3. The latency setting portion 120 may also receive and decode the latency setting codes MRA3 to MRA4 to output the additive latency AL1 in response to the additive latency setting signal PAL.

When the read command RD is applied after the additive latency AL is changed as described above, the internal read command p-RD may be generated after one clock and data DQ may be output from the data I/O portion 116 in response to the internal read command p-RD and the CAS latency CL. For example, because the read command RD is not applied continuously in FIG. 2A, data to be output may not be output continuously and bubbles occur. However, in FIG. 8A, the additive latency may be changed (e.g., immediately changed) in the normal operating state to remove bubbles which may occur while data DQ are output.

Figure 2B:
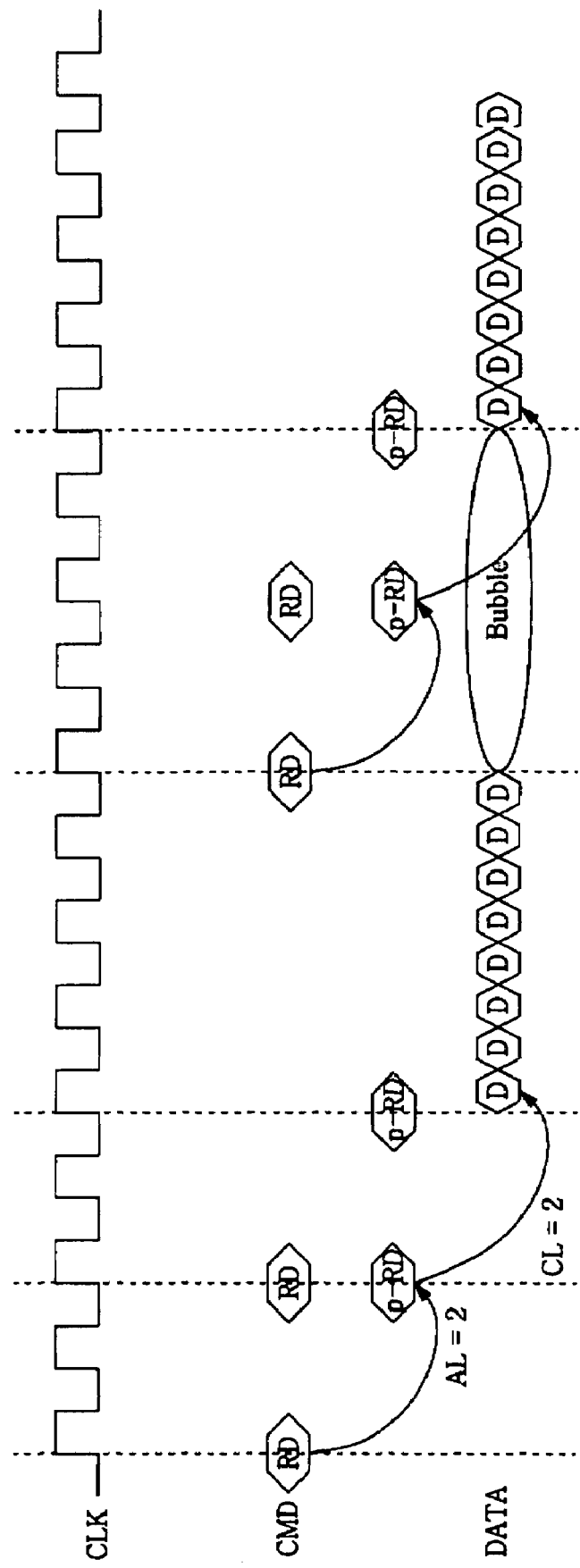

Similar to above-discussed FIG. 2B, in FIG. 8B, the additive latency may be set to 2 clocks and the CAS latency may be set to 2 clocks. In FIG. 2A, bubbles may occur in the data DQ output because the read command RD is not applied continuously, however, in FIG. 2B the read command RD may also cause bubbles due to a need for the data DQ output. However, as shown in FIG. 8B, the bubbles may be reduced in the command line by changing the additive latency AL from 2 to 5 during the normal operating state of a semiconductor memory device, according to an example embodiment.

As described above, semiconductor memory devices, according to at least some example embodiments, may change the additive latency when all or substantially all banks are not in the pre-charge state due to the additional mode setting path for changing the additive latency even in the normal operating state. Thus, bubbles in the data and command lines may be reduced, to increase (e.g., maximize) efficiency of the bandwidth of the data and command lines. In addition, because the command may be more appropriately applied from the external portion, regardless of the data output state of the data line, degree of freedom may improve.

While the example embodiments have been particularly shown and described with reference to these example embodiments, it will be understood by those of ordinary skill in the art that various changes in form and details may be made therein without departing from the spirit and scope of the present invention as defined by the following claims.

What is claimed is:

1. A semiconductor memory device, comprising:
   an additive latency setting unit configured to set an additive latency value in response to a received mode setting code during a mode setting operation, and configured to receive the mode setting code in response to an additive latency setting signal during a normal operation; and
   an additive latency changing unit for changing the additive latency value in response to the mode setting code during the normal operation.

2. The device of claim 1, further including,
   a command decoder configured to output the additive latency setting signal and the mode setting signal in response to an externally applied command.

3. The device of claim 2, wherein the additive latency setting unit includes,
   a mode register configured to receive the mode setting code in response to the mode setting signal or the additive latency setting signal and output a mode signal and a latency setting code in response to the mode setting code, the mode signal being one of a basic mode signal and an extended mode signal, and
   a latency setting unit configured to receive the latency setting code in response to the extended mode signal and a control signal output from the command decoder to output the additive latency value.

4. The device of claim 3, wherein the latency setting unit includes,
   a mode setting activating unit configured to receive the latency setting code from the mode register and transmit the latency setting code, in response to the control signal, and
   a mode determining unit configured to receive the latency setting code from the mode setting activating unit and output the latency setting code, in response to the extended mode signal.

5. The device of claim 4, wherein the additive latency changing unit includes,
    an additive latency switching unit configured to receive the latency setting code from the mode register and transmit the latency setting code in response to the additive latency setting signal.

6. The device of claim 5, wherein the latency setting unit further includes,
    a latency decoder configured to receive the latency setting code from the mode determining unit or the additive latency switching unit and decode the latency setting code to output the additive latency value.

7. The device of claim 3, wherein the mode register outputs a basic mode signal when the mode setting code is a basic mode setting code and an extended mode signal when the mode setting code is an extended mode setting code.

8. The device of claim 7, wherein the latency setting unit outputs a CAS latency value in response to the basic mode signal and the mode setting code.

9. The device of claim 8, further including,
    a memory cell array including,
        a plurality of banks, each of the plurality of banks having a plurality of memory cells arranged at crossing points between a plurality of word lines and a plurality of bit lines, and
        a sense amplifying unit having a plurality of sense amplifiers, each of the plurality of sense amplifiers being connected to the plurality of bit lines to amplify data of the memory cells,
    an address register configured to output a bank address, a row address and a column address based on an externally applied address,
    a bank selecting unit configured to select a corresponding bank among the plurality of banks in response to the bank address,
    a row decoder configured to select a corresponding word line among the plurality of word lines of the bank in response to the row address,
    a latency controller configured to delay a column address and a read or write command applied from the command decoder during a time period before outputting the column address and an internal read or write command, in response to the additive latency value applied from the additive latency setting unit or the additive latency changing unit,
    a column decoder configured to select a corresponding sense amplifier among the plurality of sense amplifiers in response to a column address applied from the latency controller, and
    a data I/O unit configured to send externally applied input data to the sense amplifier selected by the column decoder or output data detected and amplified by the sense amplifier to the external unit, in response to the internal read or write command.

* * * * *